(12) United States Patent
Vezina et al.

(10) Patent No.: US 10,466,284 B2
(45) Date of Patent: Nov. 5, 2019

(54) WINDOW FOR BOTTOM ACCESS TO AN ELECTRICAL METER CENTER

(71) Applicant: Siemens Canada Limited, Oakville (CA)

(72) Inventors: Sebastien Vezina, St-Celestin (CA); Veronique Desilets, Victoriaville (CA); Anna Sophia Kollenda, München (DE)

(73) Assignee: SIEMENS CANADA LIMITED, Oakville, Ontario (CA)

( * ) Notice: Subject to any disclaimer, the term of this patent is extended or adjusted under 35 U.S.C. 154(b) by 0 days.

(21) Appl. No.: 16/127,879

(22) Filed: Sep. 11, 2018

(65) Prior Publication Data
US 2019/0011485 A1    Jan. 10, 2019

Related U.S. Application Data

(63) Continuation of application No. 15/171,608, filed on Jun. 2, 2016, now abandoned.

(Continued)

(51) Int. Cl.
| | |
|---|---|
| *H02G 3/08* | (2006.01) |
| *G01R 22/06* | (2006.01) |
| *H02G 3/10* | (2006.01) |
| *H02G 5/04* | (2006.01) |
| *H05K 5/00* | (2006.01) |
| *H05K 5/02* | (2006.01) |
| *H05K 5/04* | (2006.01) |

(Continued)

(52) U.S. Cl.
CPC .......... *G01R 22/065* (2013.01); *G01R 22/00* (2013.01); *H02B 1/03* (2013.01); *H02B 1/04* (2013.01); *H02B 1/14* (2013.01); *H02B 1/20* (2013.01); *H02G 3/086* (2013.01); *H02G 3/10* (2013.01); *H02G 3/185* (2013.01); *H02G 3/22* (2013.01); *H02G 5/04* (2013.01); *H05K 5/0004* (2013.01); *H05K 5/0204* (2013.01); *H05K 5/0217* (2013.01); *H05K 5/0239* (2013.01); *H05K 5/04* (2013.01); *H02G 3/081* (2013.01)

(58) Field of Classification Search
CPC ........ H02B 1/041; H02B 1/042; H02B 1/043; H02B 1/044; H02B 1/048; H02B 1/0523; H02B 1/03; H02B 1/04; H02B 1/14; H02B 1/20; G01R 22/065; G01R 22/00; H02G 5/04; H02G 5/22; H02G 5/081; H02G 3/10; H02G 3/081; H02G 3/086; H02G 3/185; H05K 5/0239; H05K 5/04; H05K 5/0217; H05K 5/0204
See application file for complete search history.

(56) References Cited

U.S. PATENT DOCUMENTS 5,701,227 A * 12/1997 Ryan ................ G08B 1/08
361/118
6,414,241 B1 * 7/2002 O'Donnell ............ H02G 3/086
174/50

(Continued)

*Primary Examiner* — Steven T Sawyer
*Assistant Examiner* — Paresh H Paghadal

(57) ABSTRACT

An electric meter center comprises a frame, a floor panel assembly defining a floor and being mounted at or near a bottom of the frame, and cables routed through the floor. The floor panel assembly comprises a bottom panel defining an opening and a removable panel adapted for releasable mounting to the bottom panel to at least partially close the opening and wherein at least part of the cables are routed through the opening.

13 Claims, 11 Drawing Sheets

Related U.S. Application Data

(60) Provisional application No. 62/170,181, filed on Jun. 3, 2015, provisional application No. 62/170,183, filed on Jun. 3, 2015, provisional application No. 62/170,184, filed on Jun. 3, 2015, provisional application No. 62/170,190, filed on Jun. 3, 2015, provisional application No. 62/170,188, filed on Jun. 3, 2015, provisional application No. 62/170,187, filed on Jun. 3, 2015, provisional application No. 62/170,192, filed on Jun. 3, 2015.

(51) Int. Cl.
| | |
|---|---|
| *H02G 3/18* | (2006.01) |
| *H02G 3/22* | (2006.01) |
| *G01R 22/00* | (2006.01) |
| *H02B 1/04* | (2006.01) |
| *H02B 1/14* | (2006.01) |
| *H02B 1/20* | (2006.01) |
| *H02B 1/03* | (2006.01) |

(56) References Cited

U.S. PATENT DOCUMENTS

| | | | |
|---|---|---|---|
| 6,421,229 B1* | 7/2002 | Campbell | H02B 1/03 361/622 |
| 7,049,516 B1* | 5/2006 | Haag | H02B 1/38 174/481 |
| 2010/0258559 A1* | 10/2010 | Robinson | H02G 3/081 220/3.3 |
| 2012/0062086 A1* | 3/2012 | Garza, Jr. | H05K 5/0247 312/236 |
| 2015/0049452 A1* | 2/2015 | Franck | H05K 7/14 361/809 |

\* cited by examiner

WINDOW FOR BOTTOM ACCESS TO AN ELECTRICAL METER CENTER

CROSS-REFERENCE TO RELATED APPLICATIONS

Continuation of application Ser. No. 15/171,608 filed on Jun. 2, 2016. This application claims priority from U.S. provisional patent applications U.S. 62/170,181, U.S. 62/170,183, U.S. 62/170,184, U.S. 62/170,187, U.S. 62/170,188, U.S. 62/170,190 and U.S. 62/170,192, all filed Jun. 3, 2015, the specifications of which are hereby incorporated herein by reference in their entirety.

BACKGROUND

(a) Field

The subject matter disclosed generally relates to electric meters and enclosures therefor. More particularly, the subject matter relates to panels for a bottom access to such enclosures.

(b) Related Prior Art

Electrical equipment such as, without limitation, relays, switches, circuit breakers, electric meters, transformers, and the like, are typically housed within an enclosure, for example a housing, enclosure, box or cabinet. Such housing is provided in order to restrict access to the electrical equipment, thereby restricting potential injuries, and to prevent unauthorized tampering with the electrical equipment, in general. This is to meet the UL standards (in the US) and the CSA standards (in Canada).

There exists, in the electric metering technology, commercial electric meter centers (a.k.a. stacks or cabinets) which are used for commercial and industrial purposes such as, without limitation, shopping centers, industrial facilities, condominiums, warehouses, oil and gas industries, etc. These facilities are large enough to require a large electric meter center with a plurality of electric meters, each one of them being dedicated to a specific part of the facility (e.g., each tenant in a shopping mall).

Such electric centers include a plurality of internal sections, such as, without limitation, horizontal bar sections, breaker sections, meter sections, routing sections, and the like. The meter section comprises sockets for the electric meters. Meter connections stem from the electric meter and are directed toward a routing section, where each meter connection ends with a lug which is electrically connected to an electric cable.

Cables can be routed either upwards or downwards inside the cable routing compartment. For this reason, the bottom section of the meter center usually comprises a plate with knock-outs, i.e., partially punched openings that can be removed under pressure. Knock-outs are removed to reveal a (usually circular) opening that can accommodate a cable therein.

However, the location, shape and/or size of the knock-outs are often not appropriate for their function. In any case, the bottom plate must be removed to punch the knock-out openings. This can be tedious because several screws (e.g., approximately between 9 and 16) are used between the bottom plate and the enclosure as per CSA/UL requirements.

There is therefore a need for a more convenient access to the bottom section of the meter center and a more convenient way to pass the cables therethrough, when downward cable routing is selected. Having less screws to remove in order to punch out holes in the tub end would result in obvious time and cost savings.

SUMMARY

According to an embodiment, there is provided a floor panel assembly for installation in an electrical meter center having a frame, the floor panel assembly defining a floor of the electrical meter center which comprises cables routed through the floor. The floor panel assembly comprises a bottom panel defining an opening, the bottom panel adapted for mounting to the frame; and a removable panel adapted for releasable mounting to the bottom panel to at least partially close the opening and wherein at least part of the cables are routed through the opening.

According to an aspect, the removable panel has a first edge and a second edge opposite the first edge, and wherein the removable panel is adapted for mounting along the first edge and for releasable mounting to the bottom panel along the second edge.

According to an aspect, the bottom panel comprises a bracket and wherein the removable panel comprises, along the second edge, an extension adapted to cooperate with the bracket to provide the releasable mounting.

According to an aspect, the bracket comprises at least two brackets and the extension comprises at least two extensions adapted to cooperate with the at least two brackets to provide the releasable mounting.

According to an aspect, the electrical meter center comprises a separating wall extending substantially vertically within and from the frame, the removable panel comprises, along its first edge, an attachment wall extending substantially vertically and wherein the attachment wall is adapted for attachment to the separating wall.

According to an aspect, the attachment wall comprises at least two attachment walls adapted for attachment to the separating wall.

According to an aspect, the bottom panel comprises edges and an attachment wall along at least one of the edges of the bottom panel, the attachment wall adapted for attachment to the frame.

According to an aspect, the opening defines a window of a shape and a size and wherein the removable panel has a shape and a size that matches the shape and size of the window.

According to an aspect, the removable panel comprises at least one knock out which, once removed, is adapted for routing at least part of the cables.

According to an aspect, the removable panel comprises at least one passageway for routing at least part of the cables therethrough.

According to an embodiment, there is provided an electric meter center comprising: a frame; a floor panel assembly defining a floor and being mounted at or near a bottom of the frame; and cables routed through the floor. The floor panel assembly comprises: a bottom panel defining an opening; and a removable panel adapted for releasable mounting to the bottom panel to at least partially close the opening and wherein at least part of the cables are routed through the opening.

According to an aspect, the electric meter center further comprises a front and a back and wherein the removable panel is accessible from the front of the electric meter center.

According to an aspect, the electric meter center further comprises a separating wall attached to the frame, the separating wall dividing the front and the back of the electrical meter center and defining a cable routing section at the front in which the cables are present and a horizontal bus bar section at the back in which horizontal bus bars are present.

According to an aspect, the removable panel has a first edge and a second edge opposite the first edge, and wherein the removable panel is adapted for mounting along the first edge and for releasable mounting to the bottom panel along the second edge.

According to an aspect, the bottom panel comprises a bracket and wherein the removable panel comprises, along the second edge, an extension adapted to cooperate with the bracket to provide the releasable mounting.

According to an aspect, the bracket comprises at least two brackets and the extension comprises at least two extensions adapted to cooperate with the at least two brackets to provide the releasable mounting.

According to an aspect, the electrical meter center comprises a separating wall extending substantially vertically, the removable panel comprises, along its first edge, an attachment wall extending substantially vertically and wherein the attachment wall is adapted for attachment to the separating wall.

According to an aspect, the attachment wall comprises at least two attachment walls adapted for attachment to the separating wall.

According to an aspect, the bottom panel comprises edges and an attachment wall along at least one of the edges of the bottom panel.

According to an aspect, the opening defines a window of a first shape and size and wherein the removable panel has a shape and size that matches the shape and size of the window.

Features and advantages of the subject matter hereof will become more apparent in light of the following detailed description of selected embodiments, as illustrated in the accompanying figures. As will be realized, the subject matter disclosed and claimed is capable of modifications in various respects, all without departing from the scope of the claims. Accordingly, the drawings and the description are to be regarded as illustrative in nature, and not as restrictive and the full scope of the subject matter is set forth in the claims.

BRIEF DESCRIPTION OF THE DRAWINGS

Further features and advantages of the present disclosure will become apparent from the following detailed description, taken in combination with the appended drawings, in which.

It will be noted that throughout the appended drawings, like features are identified by like reference numerals.

DETAILED DESCRIPTION

There are disclosed embodiments of an electric meter center having an opening at the bottom section thereof that can be covered by an easily removable panel. The embodiments should also meet national standards.

Figure 1:
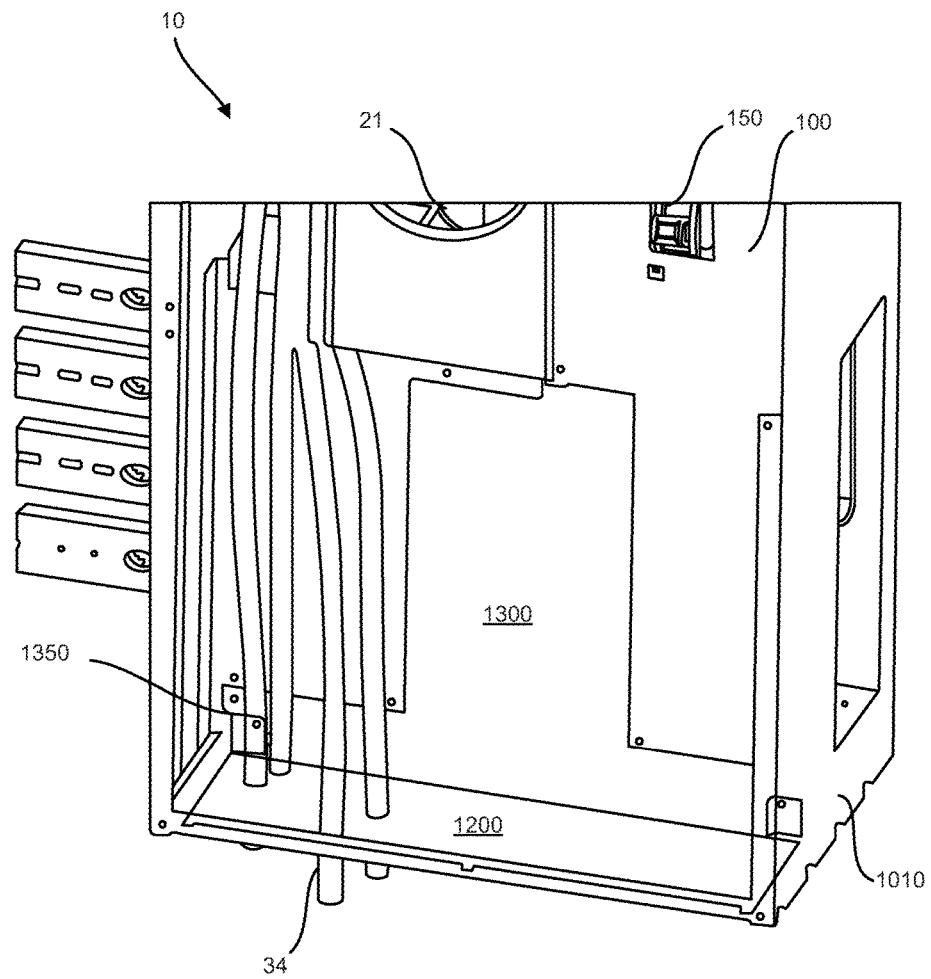
FIG. 1 is a partial perspective view of the bottom section of an electric meter center, showing a lower portion of the cable routing section with a removable panel installed at the bottom thereof, according to an embodiment.
Figure 2:
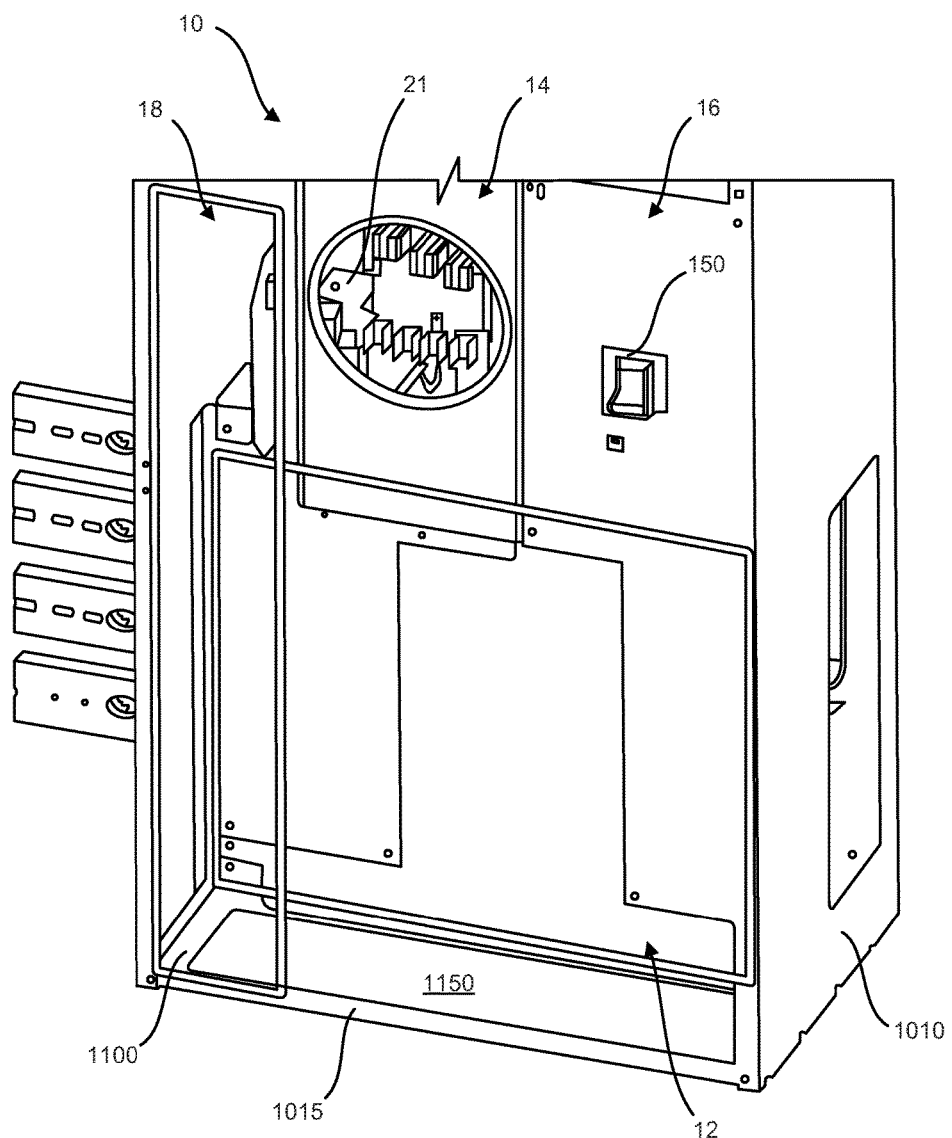
FIG. 2 is a partial perspective view of the bottom section of the electric meter center of FIG. 1, with both the cables and the removable panel removed, according to an embodiment.

Referring now to the drawings, and more particularly to FIGS. 1-2, there is shown a lower portion of an electric meter center 10. The electric meter center 10 is the enclosure that includes a plurality of internal sections, each one of the sections (horizontal bus bar section, cable routing section, etc.) being dedicated to a specific purpose. The electric meter center 10 comprises, without limitation, a horizontal bar section 12 where horizontal conduction bus bars are located, a breaker section 16 for housing breakers 150, an electric meter section 14 for housing electric meter sockets 21 (and eventually an electric meter in the socket), a cable routing section 18 for passing electric cables 34 thereinto (the electric cables being routed to an exit of the meter center 10), and the like. Cables 34, a meter socket 21 and a breaker 150 are shown in FIG. 1. The cable routing section 18 and the horizontal bar section 12 are shown in FIG. 2.

Still referring to FIGS. 1-2, there is shown that the electric meter section 14 of the electric meter center 10 comprises at least one electric meter socket 21 for installing an electric meter thereon. Each one of the plurality of electric meter sockets 21 has electrical contacts or jaws (usually seven), three of them being herein defined as meter connections, more specifically three meter connections, ending in a lateral orientation and being terminated with lugs, respectively. Other jaws include line jaws, not shown, and neutral connection. Each lug extends from a respective one of the three-phase bus bars connectors. Electric cables 34 are routed from the lugs to outside of the meter center 10, either at the top or at the bottom (as in FIG. 1, see cables 34 in the cable routing section 18). The neutral connection may be electrically connected to a cable 34 dedicated to the neutral.

However, it should be understood that one, two, three, four, or more sockets can be provided in the meter center 10.

Additional unoccupied space can be provided for future use. For example, a whole meter center 10 may be installed with only one electric metering device knowing that there will be future tenants in the building and that new electric metering devices will need to be installed then. In this case, additional cables 34 will need to be passed into the cable routing section 18 and exit therefrom, either at the top or at the bottom. It can imply that new holes need to be made on the floor of the meter center 10 to pass new cables 34 thereinto.

It should also be noted that there are important time and cost savings during the first installation during which only two screws (vs. 9 to 12 screws in prior art products) need to be removed.

Still referring to FIGS. 1-2, there is shown that the electrical meter center 10 includes the cable routing section 18 which, according to an embodiment, is independent (distinct) from the electric meter section 14. The cable routing section 18 is for receiving the insulated electrical cables and the lugs, as well as the neutral connection, while the meter section 14 is for receiving the plurality of electric metering devices and housing their sockets 21, each one comprising bus bars, also known as meter connections.

The meter center 10 usually comprises a back surface or tub, namely the meter center back, which is the surface on which at least some of the internal equipment may be fixed.

The meter center 10 is shown as being divided in four sections: the breaker section 16 on the right, the electric meter section 14 in the center, the cable routing section 18 on the left and extending to the bottom section, and a horizontal bar section 12 located at the bottom section.

FIG. 1 shows a set of axes that can be defined to better describe the spatial configuration of parts of the meter center 10. The x-axis extends horizontally in a back-to-front direction and defines depth. The y-axis extends horizontally from left to right and defines width. The z-axis extends vertically upwards and defines height.

The meter center 10 comprises an enclosure frame 1010, i.e., walls defining the enclosure itself. According to an embodiment, there are three of these walls (left, right and back) and the front of the enclosure is covered by panels 100 (some of them being shown in FIG. 1). However, as seen in FIG. 2, the enclosure comprises an enclosure front edge 1015. The enclosure front edge 1015 is a rigid part extending along the y-axis at a front position from the left wall to the right wall of the enclosure frame and defining the bottom front of the enclosure.

As shown in FIG. 2, the horizontal bar section 12 comprises bus bars which extend horizontally along the y-axis. The horizontal bar section 12 does not interfere with the cable routing section 18 since they are located at different depths (i.e., different ranges along the x-axis) in the meter center 10. More specifically, the cable routing section 18 extends to the bottom section of the meter center 10 close to the front of the meter center 10. Behind the lower portion of the cable routing section 18, there is provided a separating wall 1300, shown in FIGS. 1-2, 6-7 and 10-11. The separating wall 1300 extends substantially vertically (in the plane formed by the y-axis and z-axis) from the bottom section of the meter center 10 up to a sufficient height to cover the horizontal bar section 12, which lies behind the separating wall 1300.

The separating wall 1300 normally extends across the whole width of the electric meter center 10 (i.e., along the y-axis) in order to cover the whole width of the horizontal bar section 12 which is located behind it. The rationale behind it is that an electrician working in the cable routing section 18 should not be exposed to the bus bars of the horizontal bar section 12 which transport high currents. According to an embodiment, the separating wall 1300 can be attached or fixed directly to the enclosure frame 1010, i.e., the walls forming the frame of the meter center 10. According to another embodiment, the separating wall 1300 is attached indirectly to the enclosure frame 1010 using a separating wall support 1350, which is a piece of rigid material extending from the enclosure frame 1010. The separating wall support 1350 is shown with emphasis in FIG. 6.

As mentioned above, a meter center 10 usually comprises space for more than one electric meter. For this reason, each one of the sections mentioned above is divided in a plurality of compartments. More specifically, the breaker section 16 comprises breaker compartments, the electric meter section 14 comprises electric meter compartments, and the cable routing section 18 comprises routing compartments. Side-by-side compartments make up a stage.

Each one of the electric meter compartments comprises one electric meter, each one of the breaker compartments comprises one breaker and each one of the cable routing compartments comprises one set of lugs extending therein. Each one of the electric meter compartments is associated with a corresponding one of the breaker compartments (for the breaker corresponding with the electric meter) and a corresponding one of the routing compartments (for connecting the lugs extending the electric meter), usually adjacent to the electric meter compartment being considered.

For practical reasons (safety, protection of equipment, reliability of the electrical system, compliance with UL and/or CSA standards, etc.), all these compartments need to be covered by panels. These panels need to be removed for maintenance, installation or reparation of equipment in the meter center 10.

Still referring to FIG. 1, there is shown a removable panel 1200 at the bottom section of the meter center 10. The removable panel 1200 is the panel which has a lid portion that covers the window, or opening 1150, at the bottom section of the meter center 10.

Figure 3A:
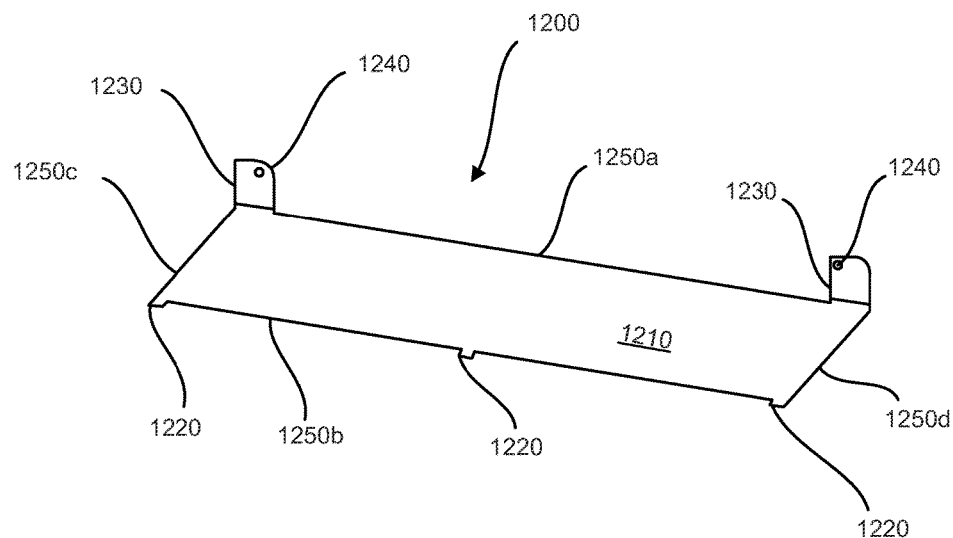
FIG. 3A is a perspective view of a removable panel, according to an embodiment.

The removable panel 1200, shown in FIG. 3A, is there to close the bottom section of the meter center 10, while being easy to remove to make modifications or alterations thereon. As shown in FIG. 1, cables 34 can pass therethrough to exit the meter center 10. For this purpose, holes 1280 need to be punched by the person performing the installation.

Prior art meter centers often include knock-outs which are circular sections within the panel having a contour which is mechanically weakened (e.g., the circumference thereof is partially punched). Knock-outs have a predetermined location and size which may not be appropriate for a given configuration. According to an embodiment, the removable panel 1200 comprises knock-outs. According to a preferred embodiment, the removable panel 1200 is rather provided without holes; it is easily removable (2 screws only) so that holes 1280 can be pierced therein by a worker, with the desired/necessary size and location.

Figure 3B:
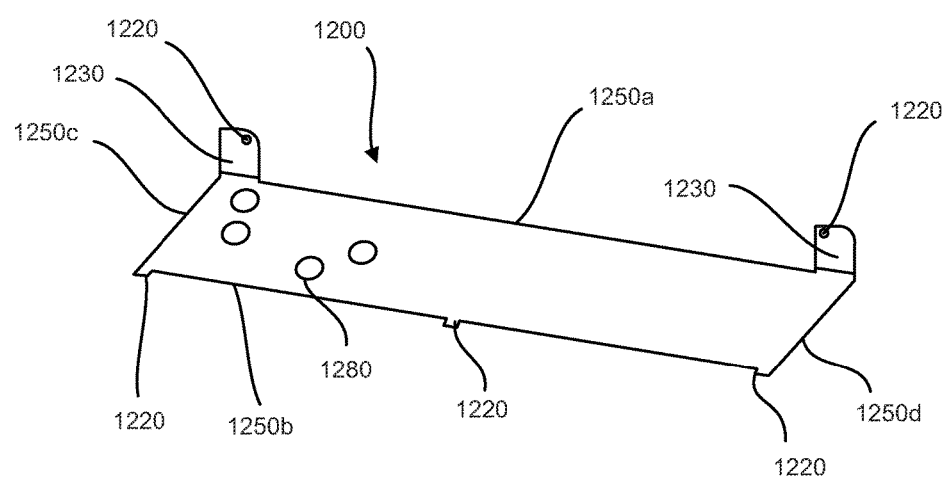
FIG. 3B is a perspective view of the removable panel of FIG. 3A with holes provided therein, according to an embodiment.

A removable panel 1200 being removable and having holes 1280 provided therein is shown in FIG. 3B. More specifically, the removable panel 1200 of FIG. 3B is the original removable panel 1200 of FIG. 3A with holes 1280 pierced or opened according to manufactured knock-out portions therein to accommodate cables 34 passing therethrough as shown in FIG. 1. As illustrated on FIG. 3C, holes 1280 may extend to the left edge 1250c of the removable panel 1200, thereby allowing removing the removable panel 1200 without having to disrupt the cable routing. For instance, the holes 1280 may result from a combination of piercing and cutting, or may be the objects of knock outs of a non-circular shape.

Holes 1280 typically have a circular shape since they have to accommodate a cable 34 therein, which typically have a circular cross-section. Usually, standards require that the hole 1280 into which a cable 34 is inserted be of a shape matching the cross-section of the cable and be slightly larger than the cross-section. However, a change in the cables' cross-section or in the standards could lead to various shapes for the holes 1280. Further, cabling routing guides embracing the cables 34 (not illustrated) may compliment both the shape of the cables 34 and the openings shape in the removable panel 1200.

Usually, holes 1280 are not provided when the removable panel 1200 is manufactured. The removable panel 1200 is rather made without holes therein and is designed to be easily removed from the meter center 10 so that a worker can remove the removable panel 1200 conveniently and make holes where and when needed.

Figure 3C:
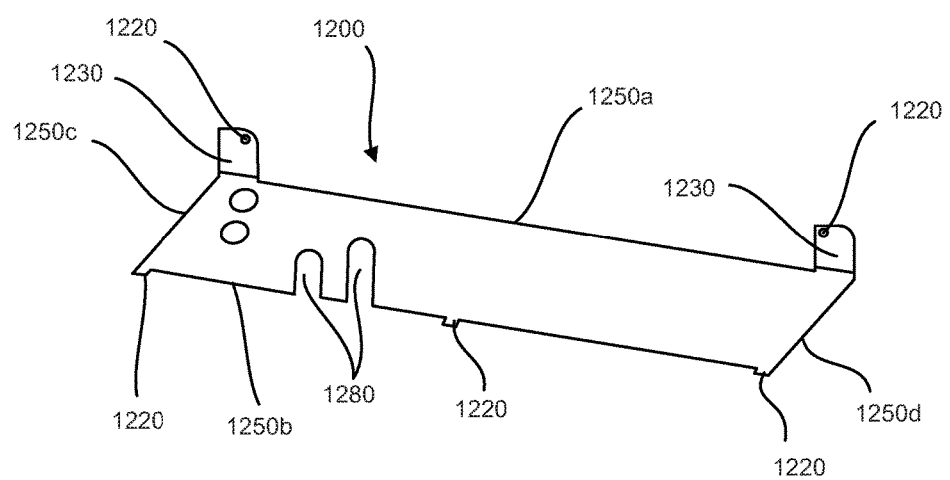
FIG. 3c is a perspective view of the removable panel of FIG. 3A with passages provided at one of the edges thereof, according to an embodiment.

FIG. 3C shows yet another embodiment of the removable panel 1200 in which an aperture is provide at one of the edges 1250 thereof. As with the holes discussed above, the aperture accommodates the passage of cables 34 when necessary. The advantage of having an aperture at one of the edges 1250 of the removable panel 1200 is that it is possible to remove the removable panel 1200 without the interference It should be noted that having removable panel 1200 provides at least two advantages discussed herein. The first advantage is that only two screws need to be removed. The second advantage is that is can be removed while the enclosure is fixed to the wall and sitting on the floor or on its stand off as in its final position. In prior art configurations (i.e., without a removable panel), the installer must remove between 9 to 16 screws to remove the tub end, and it cannot be removed if the enclosure is already fixed on the wall and sitting upright in its final position. By having the choice to remove the removable panel 1200 later in the process the installer will have better knowledge of where the holes 1280 need to be punched to accommodate cables 34 exiting the enclosure.

As understood from the combination of FIGS. 1 and 2, the removable panel 1200 covers a window or opening 1150. When the removable panel 1200 is removed, the cable routing section 18 is uncovered from the bottom.

Under some circumstances, it is allowed to have the removable panel 1200 removed during operation of the meter center 10. For example, if cables are routed to the bottom and extend through a concrete floor on which the meter center 10 lies directly, the removable panel 1200 can be removed permanently. Having a removable panel 1200 which is easily removable (by 2 screws only) is therefore an advantage when the removable panel 1200 has to be removed during first installation.

Figure 5:
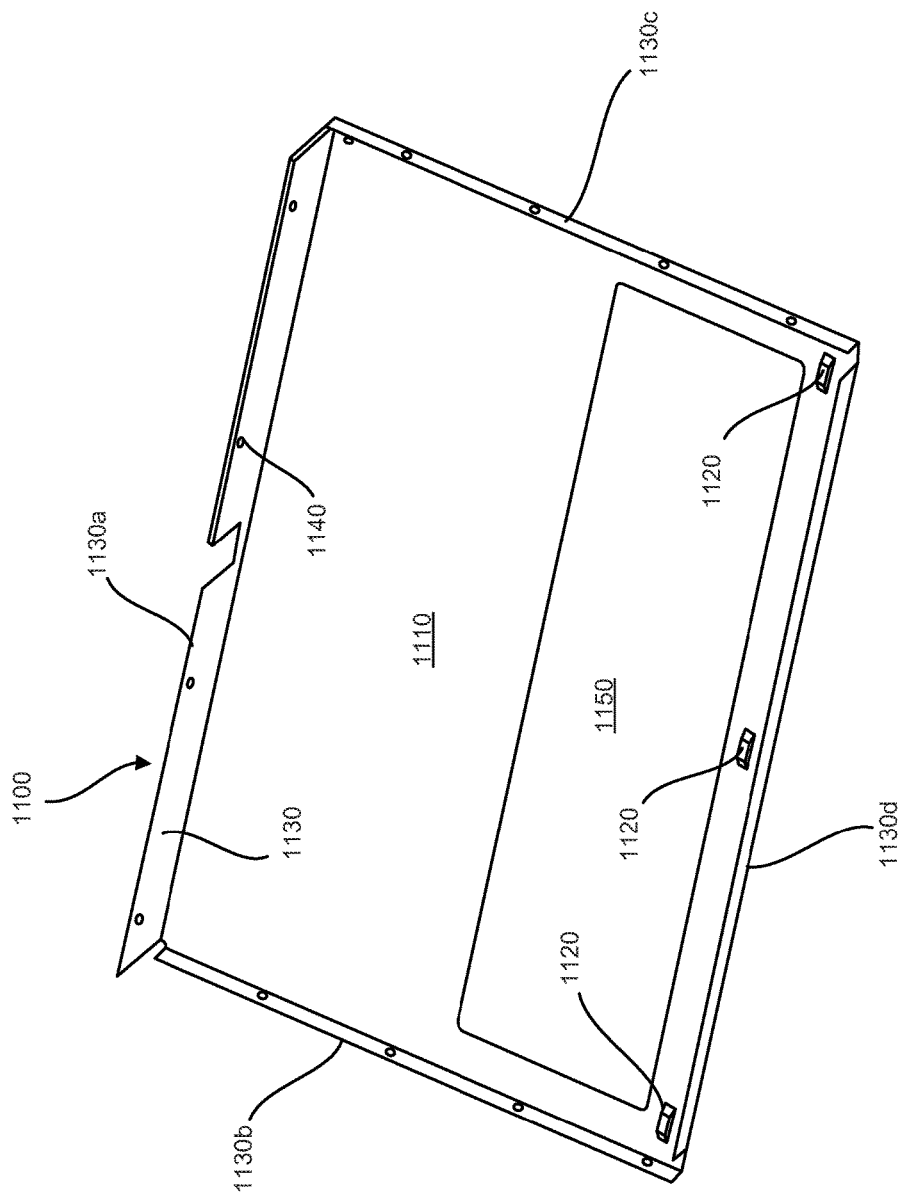
FIG. 5 is a perspective view showing a bottom panel with the removable panel removed therefrom, according to an embodiment.

The opening 1150 in FIG. 2 is made in a bottom panel 1100 illustrated in FIG. 5. The bottom panel 1100 is fixed at the bottom section of the meter center 10. In prior art installations, the bottom panel 1100 would have to be removed to punch out or remove the proper knock outs to provide passageways for routing the bottom cables 34. Now, with the removable panel 1200 being removable, the bottom panel 1100 does not need to be removed anymore, thus keeping the structural cohesion of the meter center 10, having the support of the bottom of the enclosure intact at all times.

According to an embodiment, the bottom panel 1100 (of FIGS. 2 and 5) and removable panel 1200 (of FIGS. 1 and 3A to 3C) from the floor panel assembly (not numbered). As shown in FIG. 5, the bottom panel 1100 has a floor portion 1110 which is substantially flat and which is for defining the floor of the meter center 10. As mentioned above, the floor portion 1110 (FIGS. 5 and 6) is shaped as to define an opening 1150 (FIG. 5) which can receive the removable panel 1200 and be covered thereby. As mentioned above, the opening 1150 may also be left completely open is some circumstances.

Referring to FIG. 5, there is shown the floor portion 1110 which comprises a large surface that is mostly used as a floor for the horizontal bar section 12 and structural support for the bottom section of the enclosure. The separating wall 1300 extends vertically from the edge of the floor portion 1110 which defines the opening 1150, or close thereto. This allows the large flat surface of the floor portion 1110 to be under the horizontal bar section 12 and the opening 1150 to be under the cable routing section 18. Accordingly, a first floor portion is defined on a first side of the separating wall 1300 and a second floor portion on the other side of the separating wall 1300, one having the opening 1150 therethrough and one having no opening.

According to an embodiment, as shown in FIGS. 2 and 5, the opening 1150 is almost as wide (y-axis) as the meter center 10, and it is wider than the cable routing section 18 (see FIG. 2). It is also almost as deep (x-axis) as the cable routing section 18. It is understood that the width and depth of the opening 1150 represented in FIG. 5 are not exact and may vary depending on the particular situation.

Although the opening 1150 is always shown as being rectangular, other embodiments can have an opening 1150 of a different shape, such as elliptical, polygonal or irregular, etc. These other shapes may however be harder to manufacture.

Therefore, the meter center 10, shown in FIGS. 1-2, has its floor or "bottom" permanently formed by the bottom panel 1100 illustrated in FIG. 5, which has the opening 1150 that can be covered by the removable panel 1200 illustrated in FIGS. 3A-3B, which may also be described as releasably closing the opening 1150. There will now be described the relation between those parts.

As shown in FIG. 5, the bottom panel 1100 has the width and depth to form the bottom section of the meter center 10. It has usually a rectangular contour that can match the bottom circumference of the meter center 10. The bottom panel 1100 comprises attachment walls 1130*a*, 1130*b*, 1130*c*, 1130*d* which are provided on the edges (rear, front, left and right) of the bottom panel 1100 and extend vertically (in the z-axis) therefrom. FIG. 5 shows a bottom panel 1100 with a (tall) rear attachment wall 1130*a*. There are shown screw holes 1140 for screwing the rear attachment wall 1130*a* to the back wall of the enclosure frame 1010. FIG. 5 further shows the bottom panel 1100 with smaller attachment walls 1130*b*, 1130*c*, 1130*d* at the front, left and right edges of the bottom panel 1100. They also comprise screw holes 1140 to screw these attachment walls 1130*a*, 1130*b*, 1130*c*, 1130*d* on the side walls of the enclosure frame 1010 forming the meter center 10. In this embodiment, there are 12 screws that go in screw holes 1140 to fix the bottom panel 1100 to meter center 10. FIG. 5 further shows a small wall in the front of the bottom wall, close to the front edge of the opening 1150, which is to be adjacent (along) the enclosure front edge 1015 inside the meter center 10. This small front wall is not shown with screw holes and would therefore lean on the enclosure front edge 1015, but in another embodiment, it could comprise screw holes to screw this wall to the enclosure front edge 1015 or covers.

Figure 4:
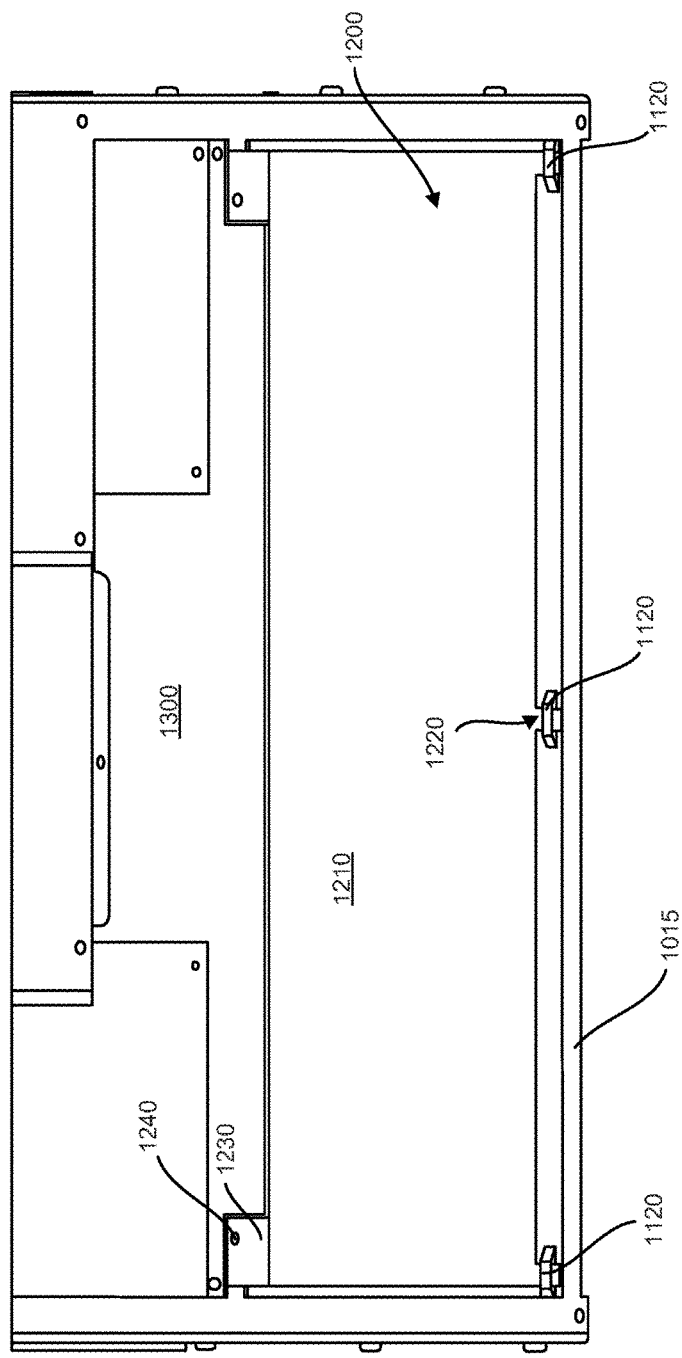
FIG. 4 is a partial front perspective view of an electric meter center showing a bottom panel with the removable panel installed thereon, according to an embodiment.

As shown on FIG. 5, the bottom panel 1100 comprises a floor portion 1110 which extends in a horizontal plane defined by the x-axis and y-axis and constitutes the floor of the meter center 10. The floor portion 1110 is usually made of a rigid material, such as a metal, and the opening 1150 is cut therein. The main portion 1110 comprises a rear section which forms the floor of the horizontal bar section 12 and which, in the embodiment shown, does not have apertures therein. In other embodiments, the rear section of the floor portion 1110 comprises apertures therethrough. In the front, the floor portion 1110 defines the contour on three sides (left, front, right) of the opening 1150. The front section of the floor portion 1110 comprises brackets 1120 (three of them are shown in FIGS. 4-5), the role of which is described further below.

Now referring back to the removable panel 1200 shown in FIGS. 3A-3B, the removable panel 1200 should have a shape and size which covers completely the opening 1150 (so that the opening 1150 is fully covered by the removable panel 1200 not when the removable panel 1200 is installed). Preferably, the removable panel 1200 has a shape that grossly matches the shape of the opening 1150.

The removable panel 1200 has a lid portion 1210 which extends in the horizontal plane formed by the x-axis and y-axis, as seen in FIG. 3A. In fact, the opening 1150 is to be covered by the lid portion 1210 of the removable panel 1200 when the bottom panel 1100 is mounted on the electric meter center 10. The removable panel 1200 further comprises a rear edge 1250a, a front edge 1250b, a left edge 1250c and a right edge 1250d.

Figure 10:
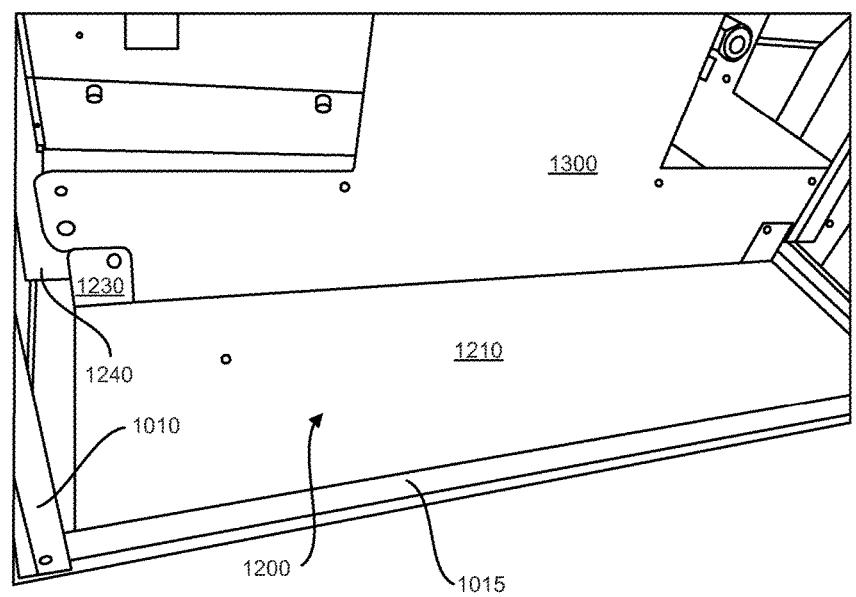
FIG. 10 is a perspective view of a horizontal bar section of an electric meter center showing the removable panel installed at the bottom section of the electric meter center, according to an embodiment.
Figure 11:
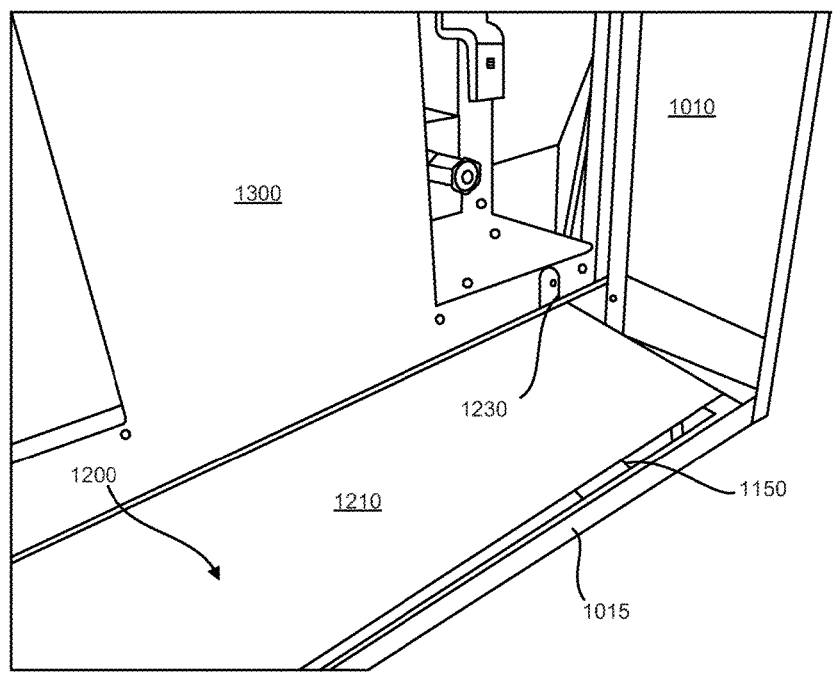
FIG. 11 is a perspective view of a horizontal bar section of an electric meter center showing the removable panel being installed/uninstalled at the bottom section of the electric meter center, according to an embodiment.

As referenced in FIGS. 10-11, the separating wall 1300 extends vertically from the bottom panel 1100. The separating wall 1300 extends from a line along the y-axis provided close to the back edge of the opening 1150. When the removable panel 1200 is being installed, its back edge is located very close to the separating wall 1300. For this reason, attachment means for the removable panel 1200 can be provided in the form of attachment walls 1230, shown in FIG. 3A, which comprise screw holes 1240 to screw the attachment walls 1230 to the separating wall 1300, thereby providing a fastening mechanism.

Figure 6:
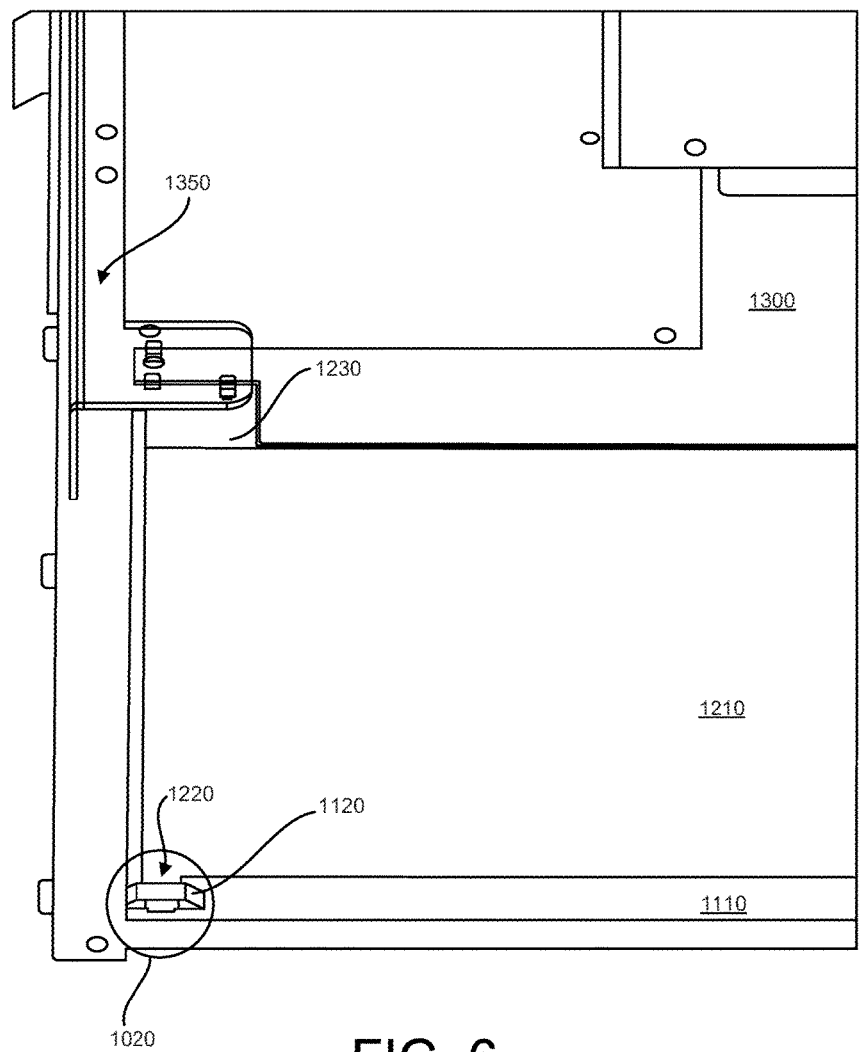
FIG. 6 is a partial front perspective view of a horizontal bar section of an electric meter center showing how the removable panel is attached to the bottom section of the electric meter center, according to an embodiment.
Figure 7:
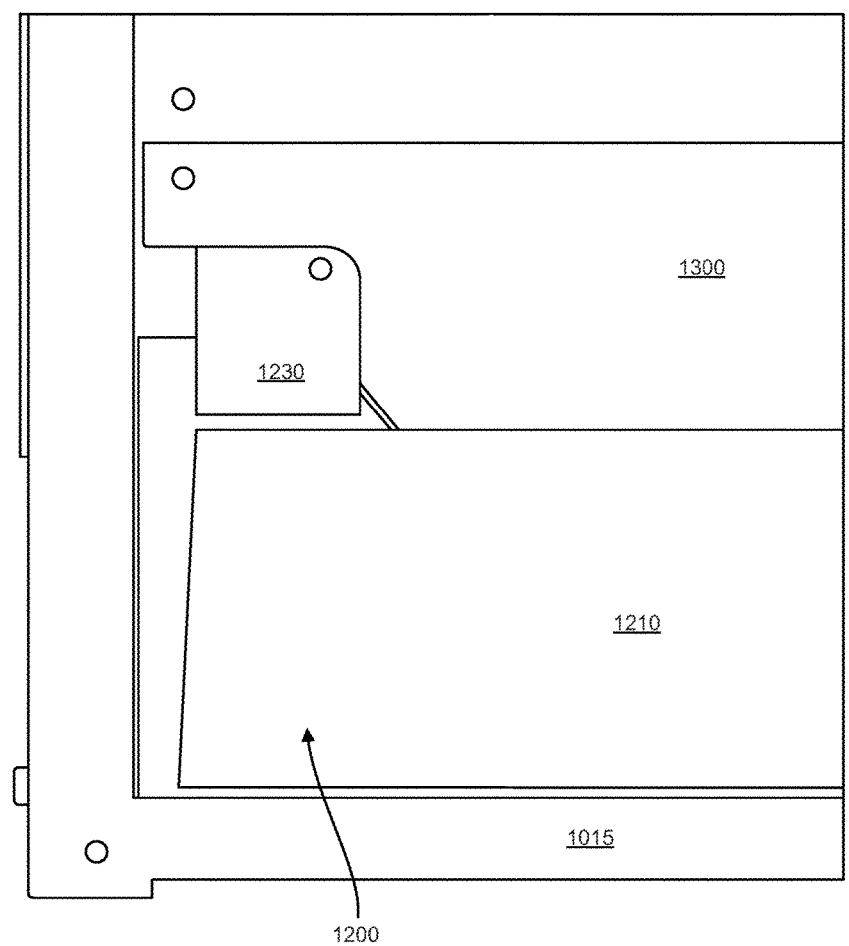
FIG. 7 is a partial front perspective view of a horizontal bar section of the electric meter center of FIG. 6.

According to another embodiment shown in FIGS. 6-7, the separating wall 1300 is held to the enclosure frame by a separating wall support 1350 on both sides of the separating wall 1300. The attachment walls 1230 are provided on the rear edge 1250a (FIG. 3C) of the removable panel 1200 in order to be adjacent the separating wall supports 1350 when the removable panel 1200 is installed. The attachment walls 1230 are screwed to the separating wall supports 1350 as for the separating wall 1300.

Although attachment means were described above as being screws, other attachment means can be used instead of screws, as long as they provide a solid attachment. Permanent attachment of the bottom panel 1100 can include soldering, welding, gluing, nailing, etc. Attachment of the removable panel may also include gluing, nailing, or the use of easily detachable attachments, such as a string (with a node) or a Velcro™ attachment. However, screws are dominant in the market of electrical enclosures.

The removable panel 1200 is not screwed on all its edges 1250. In fact, it includes extensions 1220 which are for insertion into the brackets 1120 to form a pivotal releasable mounting 1020, as shown in FIG. 6. Although there are no screws in this attachment, it prevents the movement of the removable panel 1200 when the attachment walls 1230 are screwed (to either the separating wall 1300 or to the separating wall support 1350), thereby providing a mounting mechanism distal to, or located at a second edge (front edge 1250b) opposite the first edge (back edge 1250a) where the fastening mechanism (screen attachment) is located. Indeed, the pivotal releasable mounting 1020 only allows the translation of the removable panel 1200 in the x-axis toward the back. When the removable panel 1200 leans on the separating wall 1300, this translating movement is impossible.

If a worker needs to remove the removable panel 1200, he only needs to unscrew the attachment walls 1230 and pull them up. This will induce a pivotal movement around the y-axis passing by the pivotal releasable mounting 1020; when the attachment walls 1230 are sufficiently lifted up, the removable panel 1200 can simply be removed. The need for additional screws that would need to be screwed and unscrewed is by-passed by the pivotal releasable mounting 1020 formed by the extension and bracket combination.

According to another embodiment (not shown), the extension 1220 is provided on the floor portion 1110 of the bottom panel 1100 and the brackets 1120 are provided on the removable panel 1200.

Figure 8:
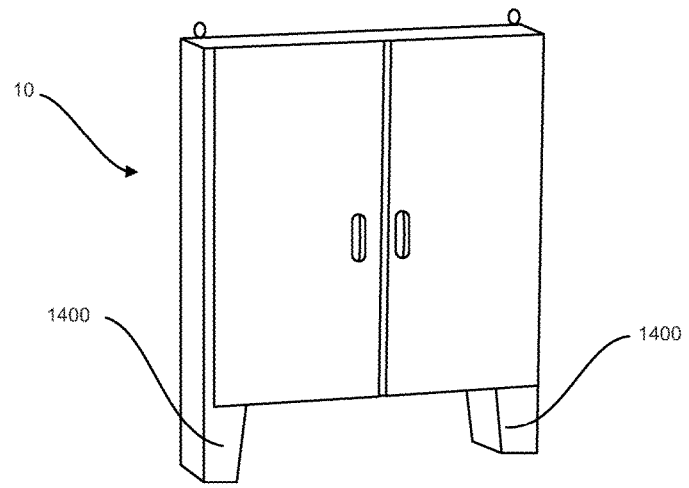
FIG. 8 is a front perspective view of a generic electrical enclosure used as a stand, according to an embodiment.
Figures 9A, 9B:
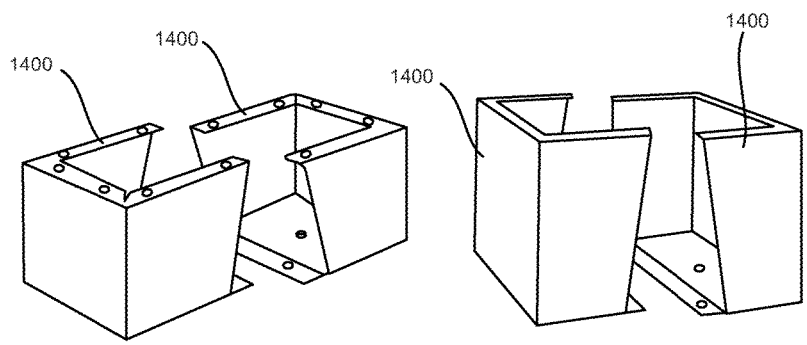
FIGS. 9A and 9B are perspective views of a stand for mounting an electrical enclosure, according to an embodiment.

According to an embodiment, the meter center 10 is installed on a stand 1400 (or a pair of stands 1400), as shown in FIG. 8 (in which a generic electrical enclosure is illustrated). The stands 1400 are simply feet that can be placed on the floor and on which the meter center 10 can be mounted, as shown in FIGS. 9A-9B.

According to an embodiment, all relevant parts are metallic sheets which are protected from corrosion (e.g., galvanized, painted, etc.). They are sized according to their purpose and, if necessary, are bent at specific locations thereon.

It will be noted that if the walls and panels comprise bent metal portions, it is advantageous since they are simple to manufacture. The only steps needed are bending and making small holes (for screwing). This simplicity (no machining or complex parts needed) is reflected in a low cost of production.

Accordingly, preferred manufacturing method involves sheet metal manufacturing processes such as metal sheet cutting, metal sheet bending, metal sheet knock-out process and metal sheet piercing, as metal sheet treatments such as galvanizing and painting. As a result, low cost production is ensured.

While preferred embodiments have been described above and illustrated in the accompanying drawings, it will be evident to those skilled in the art that modifications may be made without departing from this disclosure. Such modifications are considered as possible variants comprised in the scope of the disclosure.

The invention claimed is:

1. A floor panel assembly for installation in an electrical meter center having a frame, the floor panel assembly defining a floor of the electrical meter center which comprises cables routed through the floor, the floor panel assembly comprising:
   a bottom panel defining an opening, the bottom panel adapted for mounting to the frame;
   a removable panel adapted for releasable mounting to the bottom panel to at least partially close the opening and wherein at least part of the cables are routed through the opening,
   wherein the opening defines a first shape and a first size of a window relative to the removable panel,
   wherein the removable panel has a second shape and a second size that matches or overlaps the first shape and the first size of the window,
   wherein the removable panel having a second edge such that an aperture is provided in the removable panel at the second edge so that it is possible to remove the removable panel without interference, wherein the removable panel has a first edge and the second edge opposite the first edge, wherein the bottom panel comprises a bracket and wherein the removable panel comprises, along the second edge, an extension for insertion into the bracket to form a pivotal releasable mounting; and a separating wall extending substantially vertically within and from the frame, the removable panel comprises, along the first edge, an attachment wall extending substantially vertically and wherein the attachment wall is adapted for attachment to the separating wall such that the removable panel can be removed by unscrewing the attachment wall and pulling it up as this will induce a pivotal movement around a y-axis passing by the pivotal releasable mounting so that when the attachment wall is sufficiently lifted up the removable panel can simply be removed.

2. The floor panel assembly of claim 1, wherein the removable panel has a first edge and a second edge opposite the first edge, and wherein the removable panel is adapted for mounting along the first edge and for releasable mounting to the bottom panel along the second edge.

3. The floor panel assembly of claim 2, wherein the bracket comprises at least two brackets and the extension comprises at least two extensions adapted to cooperate with the at least two brackets to provide the releasable mounting.

4. The floor panel assembly of claim 2, wherein the attachment wall comprises at least two attachment walls adapted for attachment to the separating wall.

5. The floor panel assembly of claim 1, wherein the bottom panel comprises edges and an attachment wall along at least one of the edges of the bottom panel, the attachment wall adapted for attachment to the frame.

6. The floor panel assembly of claim 1, wherein the removable panel comprises at least one knock out which, once removed, is adapted for routing at least part of the cables.

7. An electric meter center comprising:
a frame;
a floor panel assembly defining a floor and being mounted at or near a bottom of the frame; and
cables routed through the floor;
wherein the floor panel assembly comprises:
a bottom panel defining an opening;
a removable panel adapted for releasable mounting to the bottom panel to at least partially close the opening and wherein at least part of the cables are routed through the opening,
wherein the opening defines a first shape and a first size of a window relative to the removable panel,
wherein the removable panel has a second shape and a second size that matches or overlaps the first shape and the first size of the window,
wherein the removable panel having a second edge such that an aperture is provided in the removable panel at the second edge so that it is possible to remove the removable panel without interference,
wherein the removable panel has a first edge and the second edge opposite the first edge,
wherein the bottom panel comprises a bracket and wherein the removable panel comprises, along the second edge, an extension for insertion into the bracket to form a pivotal releasable mounting; and
a separating wall extending substantially vertically within and from the frame, the removable panel comprises, along the first edge, an attachment wall extending substantially vertically and wherein the attachment wall is adapted for attachment to the separating wall such that the removable panel can be removed by unscrewing the attachment wall and pulling it up as this will induce a pivotal movement around a y-axis passing by the pivotal releasable mounting so that when the attachment wall is sufficiently lifted up the removable panel can simply be removed.

8. The electric meter center of claim 7, further comprising a front and a back and wherein the removable panel is accessible from the front of the electric meter center.

9. The electric meter center of claim 7, wherein the separating wall dividing the front and the back of the electric meter center and defining a cable routing section at the front in which the cables are present and a horizontal bus bar section at the back in which horizontal bus bars are present.

10. The electric meter center of claim 7, wherein the bottom panel comprises edges and an attachment wall along at least one of the edges of the bottom panel.

11. The electric meter center of claim 7, wherein the removable panel is adapted for mounting along the first edge and for releasable mounting to the bottom panel along the second edge.

12. The electric meter center of claim 7, wherein the bracket comprises at least two brackets and the extension comprises at least two extensions adapted to cooperate with the at least two brackets to provide releasable mounting.

13. The electric meter center of claim 7, wherein the attachment wall comprises at least two attachment walls adapted for attachment to the separating wall.

\* \* \* \* \*